(12) United States Patent
Ikefuji et al.

(10) Patent No.: US 6,181,001 B1
(45) Date of Patent: Jan. 30, 2001

(54) CARD MOUNTED WITH CIRCUIT CHIP AND CIRCUIT CHIP MODULE

(75) Inventors: Yoshihiro Ikefuji; Shigemi Chimura; Hiroharu Okada, all of Kyoto (JP)

(73) Assignee: Rohm Co., Ltd., Kyoto (JP)

(*) Notice: Under 35 U.S.C. 154(b), the term of this patent shall be extended for 0 days.

(21) Appl. No.: 09/331,191

(22) PCT Filed: Dec. 22, 1997

(86) PCT No.: PCT/JP97/04773

§ 371 Date: Jun. 24, 1999

§ 102(e) Date: Jun. 24, 1999

(87) PCT Pub. No.: WO98/29264

PCT Pub. Date: Jul. 9, 1998

(30) Foreign Application Priority Data

Dec. 27, 1996 (JP) .................................................. 8-351383

(51) Int. Cl.$^7$ .................................................. H01L 23/02
(52) U.S. Cl. .................. 257/679; 257/678; 257/687; 257/723; 257/724
(58) Field of Search .................. 257/679, 678, 257/687, 723, 724

(56) References Cited

U.S. PATENT DOCUMENTS

| | | |
|---|---|---|
| 5,598,032 | * 1/1997 | Fidalgo . |
| 5,690,773 | * 11/1997 | Figalgo et al. . |
| 5,705,852 | * 1/1998 | Orihara et al. . |
| 5,710,458 | * 1/1998 | Iwasaki . |
| 5,847,931 | * 12/1998 | Gaumet et al. . |
| 6,049,463 | * 4/2000 | O'Malley et al. . |

FOREIGN PATENT DOCUMENTS

| | | |
|---|---|---|
| 4-127290 | 4/1992 | (JP) . |
| 4-260990 | 9/1992 | (JP) . |
| 5-250529 | 9/1993 | (JP) . |
| 7-200766 | 8/1995 | (JP) . |
| 8-282167 | 10/1996 | (JP) . |

* cited by examiner

*Primary Examiner*—Sheila V. Clark
(74) *Attorney, Agent, or Firm*—Arent Fox Kintner; Plotkin & Kahn, PLLC

(57) ABSTRACT

A circuit chip mounted card has a processing-circuit layer 106 in which is constructed a processing unit including a non-volatile memory, a modulation/demodulation circuit and a capacitor for providing a process associated with communication. In the processing-circuit layer is also constructed a coil 44 of a looped metal wire.

Communicating function is completely provided only by a single IC chip 104 with the function of the processing unit and that of an antenna integrated therewith. Thus IC chip 104 does not require external wiring and will thus not suffer from an accidentally cut-off wire or the like. It is also dispensed with an operation to connect wires so that the card can extremely readily be fabricated. Thus a circuit chip mounted card can be obtained which is highly reliable and reduces the cost for manufacturing the same.

24 Claims, 7 Drawing Sheets

CARD MOUNTED WITH CIRCUIT CHIP AND CIRCUIT CHIP MODULE

TECHNICAL FIELD

The present invention relates to circuit chip mounted cards and circuit chip modules and in particular to circuit chip mounted cards and circuit chip modules using an antenna-integrated circuit chip to enhance reliability and reduce the cost for manufacturing the same.

BACKGROUND ART

Non-contact IC cards are used at automatic ticket gates for ski-lifts, railroads and the like, for automatic load sorting, and the like. FIG. 13 shows one example of conventional, non-contact IC cards. An IC card 2 shown in FIG. 13 is a single-coil IC card comprised of a coil 4 used as an antenna, capacitors C1, C2, and an IC chip 8.

Capacitors C1, C2 and IC chip 8 are mounted to a substrate of synthetic resin in the form of a film. The substrate with capacitors C1, C2 and IC chip 8 mounted thereto is referred to as a tape automated bonding (TAB) 10.

FIG. 14A is a cross section of IC card 2. A core member 12 of synthetic resin is sandwiched between paired surface members 14 and 16. TAB 10 with capacitors C1, C2 and IC chip 8 mounted thereto is fixed to surface member 14 exposed in a hollow portion 18 provided in core member 12. A portion binding TAB 10 and IC chip 8 together is covered with a sealing member 9 of epoxy resin or the like.

Coil 4 is arranged between surface member 14 and core member 12. Coil 4 and TAB 10 are connected together by a wire 20.

FIG. 14B is a circuit diagram of IC card 2. In IC card 2, an electromagnetic wave sent from a reader/writer (not shown) is received at a resonance circuit 22 comprised of coil 4 and capacitor C1 and is used as a power source. It should be noted that capacitor C2 is a power smoothing capacitor.

Furthermore, a control unit (not shown) provided in IC chip 8 interprets information superposed on the electromagnetic wave to provide a response to the information. The response is provided by varying an impedance of resonance circuit 22. The reader/writer appreciates the response by detecting an impedance variation (or impedance reflection) of the reader/writer's resonance circuit (not shown) that is associated with the impedance variation of resonance circuit 22 of IC card 2.

Thus IC card 2 is dispensed with a power supply therein and can also provide non-contact communication of information.

However, the above conventional IC card has the following disadvantages. In IC card 2, coil 2 and TAB 10 must be connected together by wire 20.

IC card 2 is often put into a purse, a pocket of pants and the like so that it can receive considerably strong bending, twisting and pressing forces. IC card 2 shown in FIG. 14A is, however, not sufficiently thick, having a thickness t of a standard dimension. Thus IC card 2 does not have so large rigidity against bending, twisting and pressing forces. Accordingly IC card 2 is flexed significantly when it receives intense bending force or the like. When IC card 2 is thus flexed, wire 20 can be cut off or wire 20 can be disconnected from coil 4 or TAB 10. Wire 20 and coil 4 or TAB 10 can also be mutually connected unsatisfactorily in the operation to connect them together.

Furthermore, the position of TAB 10 is limited in order to ensure the space for coil 4. Thus, arranging TAB 10 at a position which suffers significant flexure, can sometimes not be avoided. As a result, IC chip 8 will also be deformed significantly. Such deformation cracks IC chip 8 and thus degrades the function of the IC card.

Thus conventional IC cards are difficult to handle and are not reliable.

Furthermore, the necessity of connecting coil 4 and TAB 10 together by wire 20 also results in cumbersome fabrication of the card and increases the cost or manufacturing the card. Furthermore, the necessity of mounting capacitors C1, C2 and the like to TAB 10 further increases the cost for manufacturing the card.

A first object of the present invention is therefore to provide a circuit chip mounted card which is reliable and reduces the cost for manufacturing the same.

A second object of the present invention is to provide a circuit chip module which is reliable and reduces the cost for manufacturing the same.

DISCLOSURE OF THE INVENTION

A circuit chip mounted card in a first aspect of the present invention includes an antenna using an electromagnetic wave to allow communication and a processing unit providing a process associated with the communication, characterized in that outside or inside the circuit chip including the processing unit a terminal of the antenna is directly connected to a terminal of the circuit chip, that the circuit chip has a surface provided with a terminal electrically connected to the incorporated processing unit, that the antenna is a metal wire fixed on a film, and that the antenna is arranged in contact with a surface of the circuit chip and also electrically connected to a terminal on the surface of the circuit chip.

With the configuration, communicating function can be completely provided merely by a single circuit chip with the function of the processing unit and that of the antenna substantially integrated therewith. Thus, the circuit chip does not require external wiring and is thus free of unsatisfactory connection associated with an operation to connect external wires. Furthermore, such accidents as cutting-off, disconnection and the like of external wires cannot happen if the card is flexed.

Furthermore the substantial integration of the antenna with the circuit chip can prevents the position of the circuit chip from being limited to ensure the space for the antenna. Thus the small-area circuit chip with the antenna integrated can be arranged at any position free of significant flexure. As a result, the circuit chip is not deformed significantly if the card receives significant force.

Furthermore the elimination of the operation to connect external wires can significantly facilitate the fabrication of the card to reduce the cost for manufacturing the same. Furthermore, incorporating the capacitors into the circuit chip can save the trouble of mounting the capacitors to further reduce the cost for manufacturing the card.

Thus a circuit chip mounted card can be provided which is highly reliable and reduces the cost for manufacturing the same.

This configuration also allows relatively simple techniques, such as printing, etching, to be used in forming the antenna on the film. It also allows relatively simple bonding techniques, such as bumping, soldering, to be used to connect the terminal and the antenna together. Thus the antenna and the circuit chip can relatively readily be integrated together.

A circuit chip mounted card in a second aspect of the present invention includes an antenna using an electromagnetic wave to allow communication and a processing unit providing a process associated with the communication, characterized in that outside or inside the circuit chip including the processing unit a terminal of the antenna is directly connected to a terminal of the circuit chip, that the circuit chip has a surface provided with a terminal electrically connected to the incorporated processing unit, and that the antenna is a metal wire wound around the circuit chip and also electrically connected to a terminal on a surface of the circuit chip.

This configuration eliminates the necessity of previously constructing a dedicated antenna. Simply winding a metal wire around the circuit chip and connecting the metal wire to the terminal facilitates the integration of the antenna with the circuit chip.

A circuit chip mounted card in a third aspect of the present invention includes an antenna using an electromagnetic wave to allow communication and a processing unit providing a process associated with the communication, characterized in that outside or inside the circuit chip including the processing unit a terminal of the antenna is directly connected to a terminal of the circuit chip, that the circuit chip has a surface provided with a terminal electrically connected to the incorporated processing unit, and that the antenna is a metal wire fixed on a surface of the circuit chip and also electrically connected to a terminal on the surface of the circuit chip.

This configuration allows relatively simple techniques, such as printing, etching, to be used to provide the antenna directly on a surface of the circuit chip. Furthermore, a pattern for printing the antenna can be formed to also connect the antenna and the terminal together when the antenna is being constructed. This eliminates the necessity of providing a separate step of connecting the antenna and the terminal together and thus further facilitates the integration of the antenna with the circuit chip. Furthermore the reduced number of the manufacturing process steps can also reduce defects and enhance the reliability of the circuit chip mounted card.

A circuit chip mounted card in a fourth aspect of the present invention includes an antenna using an electromagnetic wave to allow communication and a processing unit providing a process associated with the communication, characterized in that outside or inside the circuit chip including the processing unit a terminal of the antenna is directly connected to a terminal of the circuit chip and that the antenna is constructed of a wiring layer provided in the circuit chip and also electrically connected in the circuit chip to the processing unit.

This configuration allows a wiring layer constructing technique employed in the circuit chip to be used to construct the antenna in the circuit chip. Since communicating function is completely provided in the circuit chip, it is not necessary to provide an operation or the like to construct the antenna after the construction of the circuit chip. Thus the cost for manufacturing the card can further be reduced.

Furthermore the antenna that is not exposed external to the circuit chip can be prevented from being accidentally cut off when it is mounted to the card. Thus the reliability of the circuit chip mounted card is further enhanced.

Preferably, a resonance circuit provided in the circuit chip and comprised of a capacitor and a coil corresponding to an antenna has an adjustable resonance frequency.

In this example, the capacitance or inductance of the resonance circuit can be adjusted after the capacitor and the coil are provided in the circuit chip. This allows resonance frequency to be adjusted after the circuit elements configuring the resonance circuit are all constructed in the circuit chip.

In other words, if the conditions for manufacturing the same vary, the resonance frequency can be constant to some extent and the reliability of the circuit chip mounted card can further be enhanced. Furthermore a circuit chip accommodating a wide range of resonance frequencies can be obtained without changing a masking pattern for forming a circuit element thereof in the process of manufacturing the same, so that the cost for manufacturing the same can be reduced.

Furthermore, preferably the circuit chip has a plurality of capacitors previously constructed therein and having an interconnect selectively connected to obtain a desired resonance frequency.

Thus resonance frequency can readily be adjusted as desired.

Still preferably, the circuit chip has a plurality of coils previously constructed therein and having an interconnect selectively connected to obtain a desired resonance frequency.

Thus resonance frequency can also readily be adjusted as desired.

A circuit chip mounted card in a fifth aspect of the present invention is a circuit chip mounted card mounting thereto an antenna using an electromagnetic wave to provide communication and a processing unit providing a process associated with the communication, comprised of a first base member, a second base member, a core member layer, a circuit chip and an antenna. The second base member is spaced apart from the first base member by a predetermined distance in the direction of the thickness of the card. The core member layer is arranged between the first base member and the second base member. The circuit chip is provided with the processing unit therein, and a terminal provided on a surface thereof and electrically connected to the processing unit. The antenna of a metal wire fixed on a film, is arranged on a surface of the circuit chip and electrically connected to the terminal on the surface of the circuit chip. The circuit chip and the antenna are arranged at the core member layer.

With the configuration, communication can be provided simply via a circuit chip with the function of the processing unit and that of the antenna substantially integrated therewith. Thus the circuit chip does not require external wiring and can thus be free of unsatisfactory connection, cutting-off and the like of external wires. The elimination of the connection of external wires can also facilitate the fabrication of the card.

Furthermore it is not necessary to limit the position of the circuit chip to ensure the space for the antenna. Thus the circuit chip can be arranged at a location free of significant flexure so as to prevent deformation of the circuit chip.

Furthermore, a known technique can be used to construct the antenna on the film and also readily integrate the antenna with the circuit chip.

Consequently a circuit chip mounted card can be provided which is highly reliable and reduces the cost for manufacturing the same.

A circuit chip mounted card in a sixth aspect of the present invention is a card mounting thereto an antenna using an electromagnetic wave to provide communication and a processing unit providing a process associated with the communication, comprised of a first base member, a second base member, a core member layer, a circuit chip and an antenna. The second base member is spaced apart from the first base member by a predetermined distance in the direction of the thickness of the card. The core member layer is arranged between the first base member and the second base member. The circuit chip is provided with the processing unit therein and a terminal provided on a surface thereof and electrically connected to the processing unit. The antenna is constructed of a metal wire wound around the circuit chip and is also electrically connected to the terminal on the surface of the circuit chip. The circuit chip and the antenna are arranged at the core member layer.

With the configuration, communication can be provided simply via a circuit chip with the function of the processing unit and that of the antenna substantially integrated therewith. Thus the circuit chip does not require external wiring and can thus be free of unsatisfactory connection, cutting-off and the like of external wires. The elimination of the connection of external wires also facilitates the fabrication of the card.

Furthermore it is not necessary to limit the position of the circuit chip to ensure the space for the antenna. Thus the circuit chip can be arranged at a location free of significant flexure to prevent deformation of the circuit chip.

It is also not necessary to previously construct a dedicated antenna. Simply winding a metal wire around the circuit chip allows the antenna to be readily integrated with the circuit chip.

Thus a circuit chip mounted card can be provided which is higher reliable and reduces the cost for manufacturing the same.

A circuit chip mounted card in a seventh aspect of the present invention is a circuit chip mounted card mounting thereto an antenna using an electromagnetic wave to provide communication and a processing unit providing a process associated with the communication, comprised of a first base member, a second base member, a core member layer and a circuit chip. The second base member is spaced apart from the first base member by a predetermined distance in the direction of the thickness of the card. The core member layer is arranged between the first base member and the second base member. The circuit chip is provided with the processing unit therein and a terminal provided on a surface thereof and electrically connected to the processing unit, and the antenna is constructed of a metal wire fixed on the surface of the circuit chip and is also electrically connected to the terminal on the surface of the chip. The circuit chip is arranged at the core member layer.

With the configuration, communication can be provided simply via circuit chip with the function of the processing unit and that of the antenna substantially integrated therewith. Thus the circuit chip does not required external wiring and can thus be free of unsatisfactory connection, cutting-off and the like of external wires. The elimination of the connection of external wires can also facilitate the fabrication of the card.

Furthermore, it is not necessarily to limit the position of the circuit chip to ensure the space for the antenna. Thus the circuit chip can be arranged at a location free of significant flexure to prevent deformation of the circuit chip.

Furthermore, a known technique can be used to readily construct the antenna directly on the surface of the circuit chip and also integrate the antenna with the circuit chip.

Thus a circuit chip mounted card can be provided which is highly reliable and reduces the cost for manufacturing the same.

A circuit chip mounted card in an eighth aspect of the present invention is a card mounting thereto an antenna using an electromagnetic wave to provide communication and a processing unit providing a process associated with the communication, comprised of a first base member, a second base member, a core member layer and a circuit chip. The second base member is spaced apart from the first base member by a predetermined distance in the direction of the thickness of the card. The core member layer is arranged between the first base member and the second base member. The circuit chip is provided with the processing unit therein and the antenna is constructed of a wiling layer provided in the chip, wherein the processing unit and the antenna are electrically connected together in the chip. The circuit chip is arranged at the core member layer.

With the configuration, communication can be provided simply via a circuit chip with the function of the processing unit and that of the antenna substantially integrated therewith. Thus the circuit chip does not require external wiring and can thus be free of unsatisfactory connection, cuttingoff and the like of external wires. The elimination of the connection of external wires can also facilitate the fabrication of the card.

Furthermore it is not necessary to limit the position of the circuit chip to ensure the space for the antenna. Thus the circuit chip can be arranged at a location free of significant flexure to prevent deformation of the circuit chip.

Furthermore a wiring layer constructing technique can be used to construct the antenna in the circuit chip. It is does not necessary to construct the antenna after the construction of the circuit chip. The antenna that is not exposed external to the circuit chip can be prevented from being cut off.

Thus a circuit chip mounted card can be provided which is highly reliable and reduces the cost for manufacturing the same.

Preferably there is provided in the card a reinforcement body provided with a frame arranged to surround the circuit chip in the direction of a plane orthogonal to the direction of the thickness of the card.

In this example, the space for accommodating a circuit chip substantially integrated with the antenna can be ensured while the rigidity of the circuit chip mounted card can be enhanced effectively in a vicinity of the circuit chip. Thus the antenna or the circuit chip will not be significantly deformed if the card receives intense bending, twisting, or pressing force. Thus the reliability of the card will further be enhanced.

Preferably, a coil serving as the antenna, and at least one capacitor of the circuit elements configuring the circuit chip configure a resonance circuit.

The resonance circuit allows an electromagnetic wave sent from a reader/writer to be received and used as a power source. In response to the information sent superposed on the electromagnetic wave an impedance of the resonance circuit varies to send a response to the reader/writer. Thus the circuit chip mounted card can be dispensed with a power supply therein and also provide non-contact communication of information.

Preferably, ferroelectronics construct at least one capacitor of the circuit elements configuring the circuit chip.

Thus the range of impedance can be wider.

Preferably, the processing unit of the circuit chip includes a nonvolatile memory and a modulation/demodulation circuit.

The processing unit can provide a process associated with communication.

A circuit chip module in a ninth aspect of the present invention is a circuit chip module used for a circuit chip mounted card, comprised of a circuit chip and an antenna. The circuit chip includes a processing unit for providing a process associated with communication. The antenna is electrically connected to the processing unit and also has a terminal directly connected to a terminal of the circuit chip inside or outside the circuit chip and the antenna provides communication via an electromagnetic wave. The antenna is a metal wire fixed on a film arranged in contact with a surface of the circuit chip and this characterizes the invention.

With the configuration, communicating function can be completely provided via a single circuit chip with the function of the processing unit and that of the antenna substantially integrated therewith. Thus the circuit chip does not require external wiring and can thus be free of unsatisfactory connection, cutting-off and the like of external wires. Furthermore the elimination of the connection of external wires can also facilitate the fabrication of the card. Thus a circuit chip module can be provided which is highly reliable and reduces the cost for manufacturing the same.

This configuration allows a known technique to be used to construct the antenna on the film and also readily integrate the antenna with the circuit chip.

A circuit chip module in a tenth aspect of the present invention is a circuit chip module used for a circuit chip mounted card, comprised of a circuit chip and an antenna. The circuit chip includes a processing unit for providing a process associated with communication. The antenna is electrically connected to the processing unit and also has a terminal directly connected to a terminal of the circuit chip inside or outside the circuit chip and the antenna provides communication via an electromagnetic wave. The antenna is a metal wire fixed on or wound around the circuit chip and this characterizes the invention.

The configuration allows a known technique to be used to construct the antenna directly on a surface of the circuit chip or allows a metal wire to be simply wound around the circuit chip to readily integrate the antenna with the circuit chip.

A circuit chip module in an eleventh aspect of the present invention is a circuit chip module used for a circuit chip mounted card, comprised of a circuit chip and an antenna. The circuit chip includes a processing unit for providing a process associated with communication. The antenna is electrically connected to the processing unit and also has a terminal directly connected to a terminal of the circuit chip inside or outside the circuit chip and the antenna provides communication via an electromagnetic wave. The antenna is constructed of a wiring layer formed in the circuit chip and this characterizes the invention.

This configuration allows communicating function to be completely provided in the circuit chip. Thus it is not necessary to provide an operation or the like to construct the antenna after the construction of the circuit chip. Thus the cost for manufacturing the card can be reduced.

Preferably the circuit chip includes a capacitor and the antenna is constructed of a coil, and the capacitor and the coil are used to configure and allow a resonance circuit to have an adjustable resonance frequency.

In this example, the resonance circuit has capacitance or inductance that can be adjusted after the capacitor and the coil are constructed in the circuit chip. This allows resonance frequency to be adjusted after the circuit elements configuring the resonance circuit are all constructed in the circuit chip.

In other words, if the conditions for manufacturing the same vary, resonance frequency can be constant to some extent and the circuit chip module can thus be enhanced in reliability. Furthermore, a circuit chip accommodating a wide range of resonance frequencies can be obtained without changing a masking pattern for forming a circuit element thereof in the process for manufacturing the same, so that the cost for manufacturing the same can be reduced.

A circuit chip module in a twelfth aspect of the present invention is a circuit chip module used for a circuit chip mounted card, comprised of a circuit chip and an antenna. The circuit chip includes a processing unit for providing a process associated with communication. The antenna is electrically connected to the processing unit and also has a terminal directly connected to a terminal of the circuit chip inside or outside the circuit chip and the antenna provides communication via an electromagnetic wave. The circuit chip includes a capacitor and the antenna is constructed of a coil wherein the capacitor and the coil are used to configure and allow a resonance circuit to have an adjustable resonance frequency, and this characterizes the invention.

This configuration allows the resonance circuit to have capacitance or inductance that can be adjusted after the capacitor and the coil are constructed in the circuit chip. Thus resonance frequency can be adjusted after the circuit elements configuring the resonance circuit are all constructed in the circuit chip.

BEST MODES FOR CARRYING OUT THE INVENTION

Figure 1:
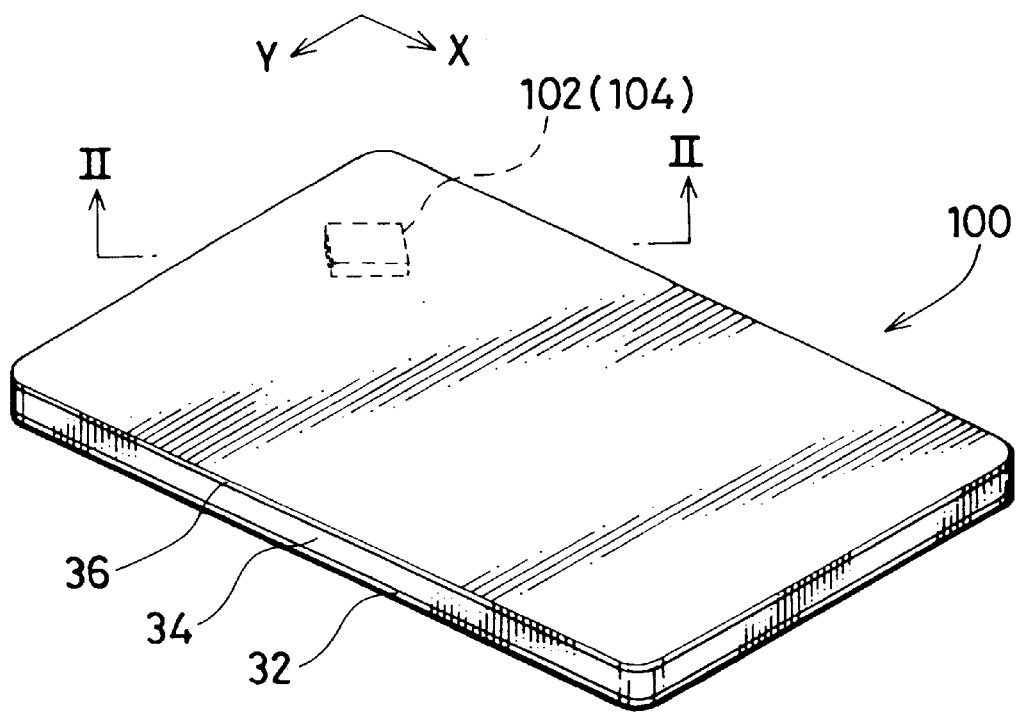
FIG. 1 shows an appearance of a non-contact IC card 100 as a circuit chip mounted card of one embodiment of the present invention.

FIG. 1 shows an appearance of a non-contact IC card 100 as a circuit chip mounted card of one embodiment of the present invention. IC card 100 is a single-coil IC card and can be used for automatic ticket gates of ski-lifts, railroads and the like, automatic load sorting, and the like.

Figure 2:
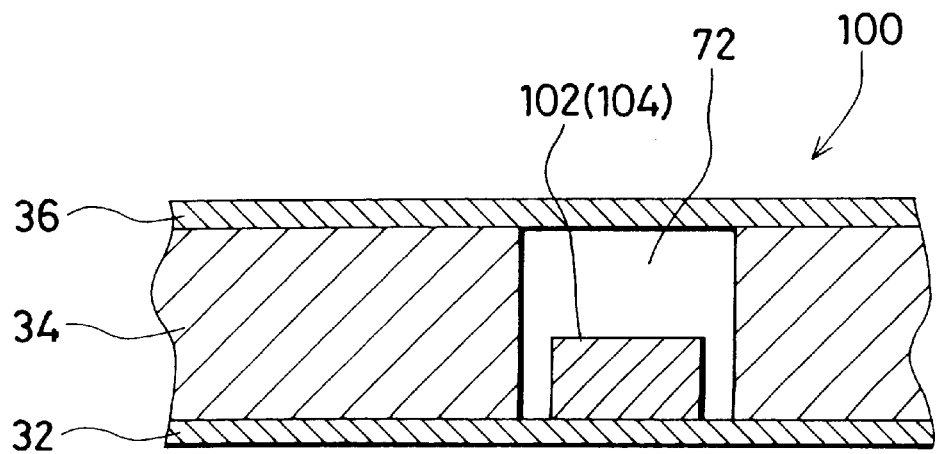
FIG. 2 is a cross section of the FIG. 1 IC card taken along line II—II.

FIG. 2 is a cross section taken along II—II of FIG. 1. IC card 100 has a surface member 32 corresponding to a first base member, a core member 34 constructing a core member layer, and a surface member 36 corresponding to a second base member that are deposited successively in the order of appearance above. Surface member 32, 36 is formed of synthetic resin such as vinyl chloride, polyethylene terephthalate PET). Core member 34 is formed of synthetic resin.

A hollow portion 72 is provided in the layer formed of core member 34. In hollow portion 72, an IC chip module 102 as a circuit chip module is fixed in contact with surface member 32. In the present embodiment the IC chip module consists of an IC chip 104 serving as a circuit chip.

Figure 3:
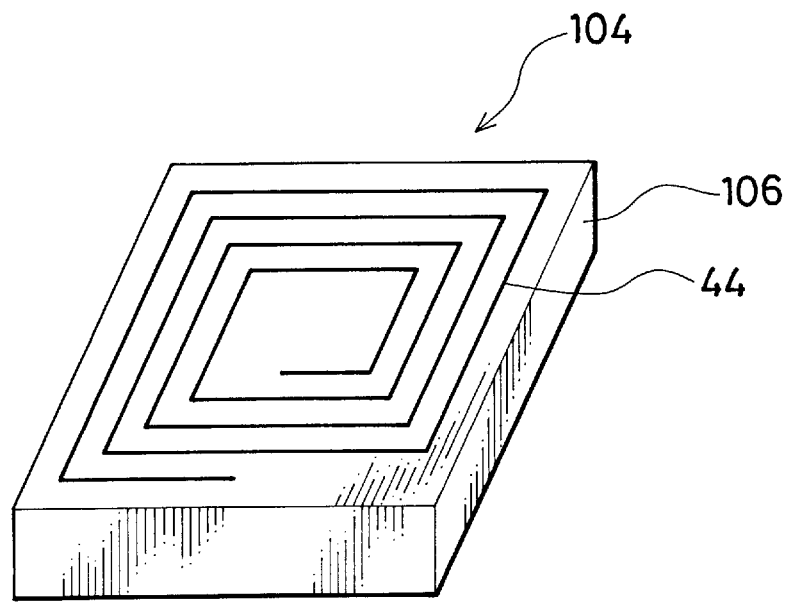
FIG. 3 is a conceptual view of an IC chip 104.

FIG. 3 is a conceptual view of IC chip 104. IC chip 104 is comprised of a processing-circuit layer 106.

Processing-circuit layer 106 is provided with a nonvolatile memory, a modulation/demodulation circuit, a capacitor and the like to configure a processing unit (not shown) providing a process associated with communication. In the present embodiment, at least one of capacitors configuring processing-circuit layer 106 is constructed of ferroelectronics, although all capacitors may be paraelectric capacitors.

The processing circuit is also comprised of a coil (or antenna) 44 constructed of a looped metal wire.

With the configuration, communicating function can be completely provided simply via a single IC chip 104 with the function of the processing unit and that of the antenna integrated therewith. Thus IC chip 104 does not require external wiring and is thus free of any unsatisfactory connection associated with an operation to connect external wires. Furthermore, IC card 100 does not suffer from such accidents as a cut-off external wire, a disconnected external wire or the like when IC card 100 is flexed.

Furthermore, coil 44 integrated with IC chip 104 prevents the position of IC chip 104 from being limited to ensure the space for coil 44. Thus the small-area IC chip 104 integrated with coil 44 can be arranged at any position free of significant flexure. Thus IC chip 104 does not significantly deform when IC card 100 receives intense force.

Furthermore the elimination of the operation to connect external wires can extremely facilitate the fabrication of the card to reduce the cost for manufacturing the same. Furthermore, incorporating a capacitor into IC chip 104 can save the trouble of mounting the capacitor to further reduce the cost for manufacturing the card.

Furthermore, communicating function can be completely provided merely via a single small IC chip 104, so that high degree of freedom in arrangement can be achieved in IC card 100. Furthermore the mounting operation only requires handling a single, previously constructed IC chip module 102. Thus the mounting operability can be improved to further reduce the cost for manufacturing the card.

In the present embodiment, communicating function completes in IC chip 104. This eliminates the necessity of providing an operation or the like to provide the coil after the construction of IC chip 104. Thus the cost for manufacturing the card can further be reduced.

Furthermore, coil 44 that is not exposed external to IC chip 104 can be prevented, e.g., from being cut off accidentally in the operation of mounting the same.

It should be noted that in the present embodiment, surface member 32, 36 is 0.1 mm thick, the entirety of IC card 100 is 0.768 mm thick and IC chip 104 is a cube having a side of 3 mm and a thickness of 0.25 mm, although the present invention is not limited to the aforementioned dimensions or materials.

Figure 14A:
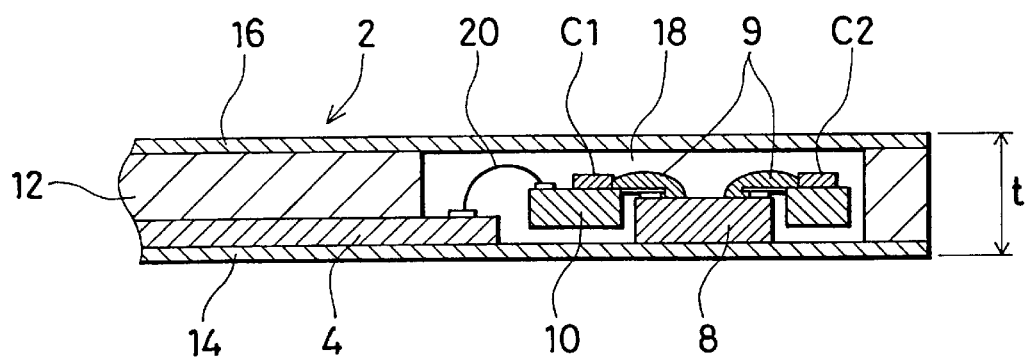
FIG. 14A is a cross section taken along line XIVA—XIVA of FIG. 13
Figure 14B:
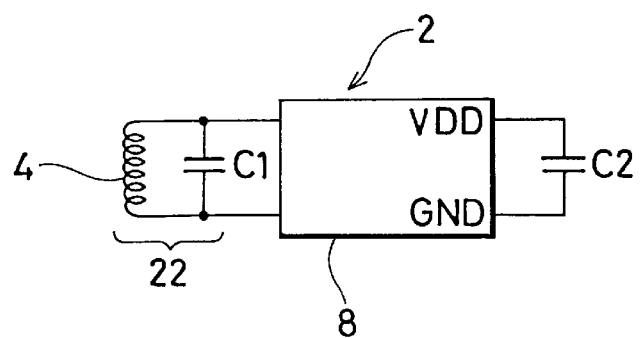
FIG. 14B is a circuit diagram of IC card 2.

Operation of IC card 100 is similar to that of conventional IC card 2. More specifically, an electromagnetic wave sent from a reader/writer (not shown) is received by a resonance circuit configured of coil 44 and a capacitor constructed at IC chip 104 and is used as a power source. It should be noted that the resonance circuit is similar in configuration to a resonance circuit 22 shown in FIG. 14B. The obtained power is smoothed by another capacitor.

IC chip 104 is internally provided with a control unit (not shown) interpreting information sent superposed on the electromagnetic wave, to make a response. The response is provided by varying an impedance of the resonance circuit. The reader/writer appreciates the response by detecting an impedance variation of its resonance circuit (not shown) that is associated with the impedance variation of the resonance circuit of IC card 100.

Thus the card can be dispensed with a power supply therein and can also provide non-contact communication of information.

It should be noted that while in the above embodiment coil 44 is provided in a single wiring layer, coil 44 may be provided over a plurality of wiring layers. With the configuration, the number of coils wound can be increased without increasing the projected area thereof.

Figure 4:
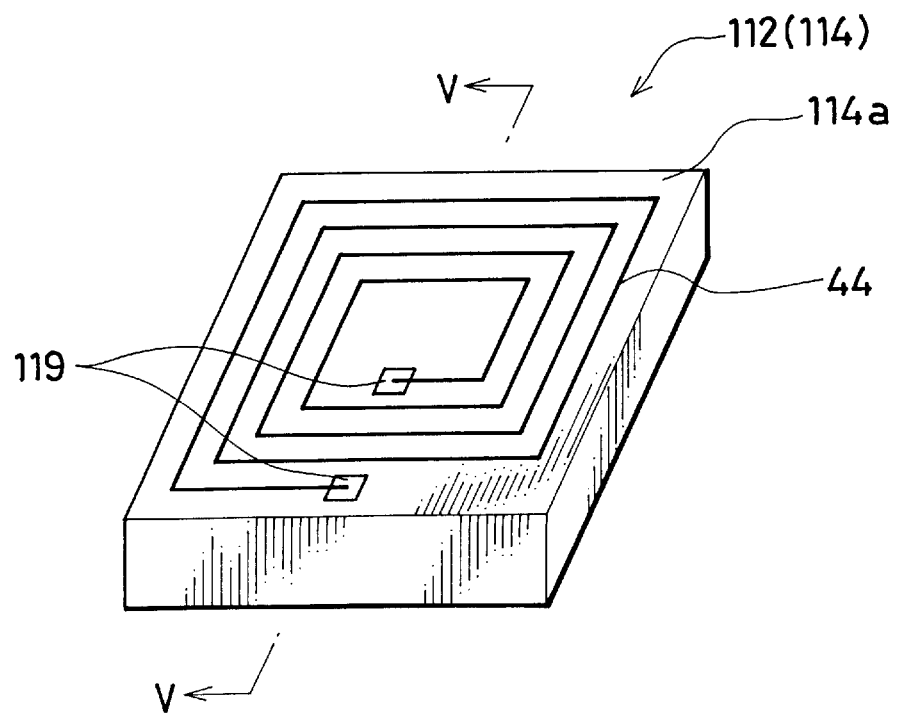
FIG. 4 is a conceptual view of an IC chip 112 as a circuit chip module of another embodiment of the present invention.

FIG. 4 is a conceptual view of an IC chip module 112 as a circuit chip module of another embodiment of the present invention. IC card with IC chip module 112 is substantially similar in appearance and cross section to IC card 100 (FIGS. 1 and 2). The IC card with IC chip module 112 is also similar in operation to IC card 110.

In the present embodiment also, IC chip module 112 is constructed only of an IC chip 114 serving as a circuit chip. As shown in FIG. 4, coil 44 is printed and thus formed directly on an upper surface 114a of IC chip 114.

Figure 5:
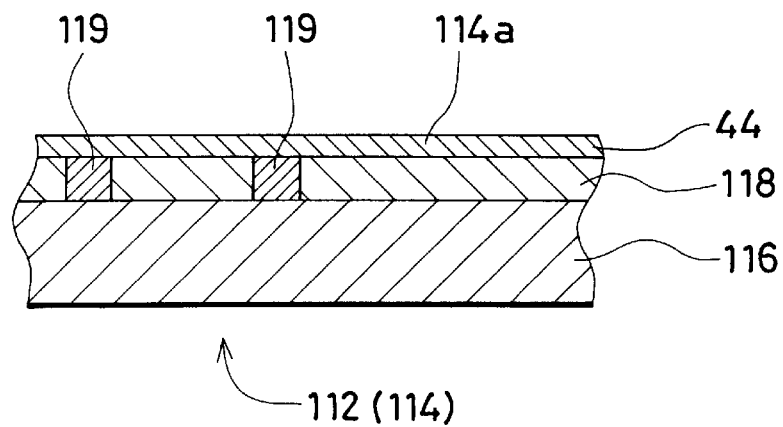
FIG. 5 is a cross section taken along line V—V of FIG. 4.

FIG. 5 is a cross section taken along line V—V of FIG. 4. IC chip 114 is comprised of a processing-circuit layer 116, and a passivation film 18 serving as a protection film provided on processing-circuit layer 116. Passivation film 118 is formed, e.g., of silicon nitride film deposited using PSG, the plasma CVD technique or the like. A reflow step or the like is employed to planarize a surface of passivation film 118 to form upper surface 114a of IC chip 114.

A terminal 119 is provided at upper surface 114a of IC chip 114. Terminal 119 penetrates passivation film 118 and is thus electrically connected to processing-circuit layer 116. In the present embodiment, terminal 119 is formed from gold (Au).

On IC chip 114 upper surface 114a, a fine metal wire is printed in the form of a loop to form coil 44, as described hereinbefore. Coil 44 has an end electrically connected to processing-circuit layer 116 via terminal 119.

Processing-circuit layer 116 is provided with a nonvolatile memory, a modulation/demodulation circuit, a capacitor and the like to configure a processing unit (not shown) providing a process associated with communication.

With the configuration, a relatively simple printing technique can be used to form coil 44 directly on a surface of IC chip 114. Furthermore, a pattern for printing coil 44 can be formed to also connect coil 44 and terminal 119 together when coil 44 is being formed. This eliminates the necessity of providing a separate step of connecting coil 44 and terminal 119 together. That is, coil 44 and IC chip 114 can readily be integrated together. The reduced number of the manufacturing steps can also reduce defects.

It should be noted while in the present embodiment coil 44 is printed on IC chip 114 upper surface 114a, coil 44 may, for example, be etched on IC chip 114 upper surface 114a.

Figure 6:
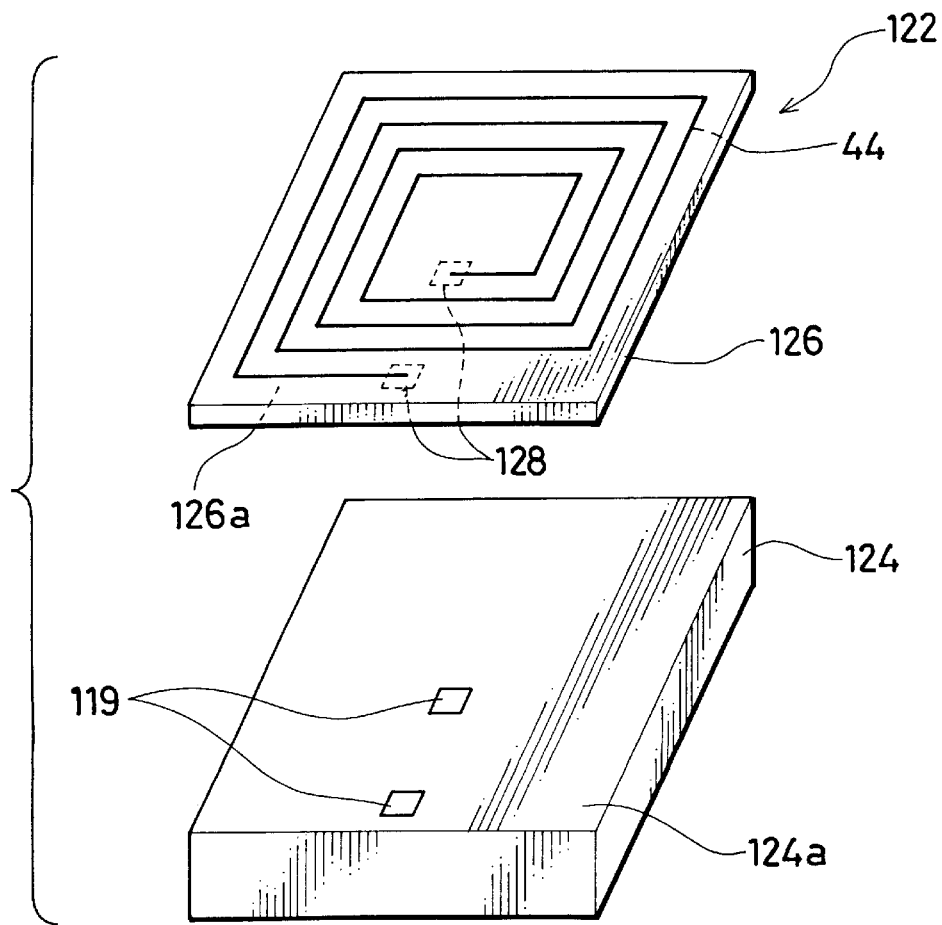
FIG. 6 is a conceptual view of an IC chip module 122 as a circuit chip module of still another embodiment of the present invention.

FIG. 6 is a conceptual view of an IC chip module 122 corresponding to a circuit module of still another embodiment of the present invention. An IC card with IC chip module 122 is substantially similar in appearance and cross section to IC card 100 (shown in FIGS. 1 and 2). The IC card with IC chip module 122 is also similar in operation to IC card 100.

The present embodiment is dissimilar to the above each embodiment, with IC chip module 122 comprised of an IC chip 24 serving as a circuit chip and a film with coil 44 formed thereon.

IC chip 124 is substantially similar in configuration to the aforementioned IC chip 114 (shown in FIG. 4), with terminal 119 provided at an upper surface 124a covered with a passivation film.

On film 126 lower surface 126a, a fine metal wire is printed or etched in the form of a loop to form coil 44, as has been described hereinbefore. A terminal 128 is formed at an end of coil 44.

Film 126 lower surface 126a is superposed on IC chip 124 upper surface 124a to bind IC chip 124 terminal 119 and film 126 terminal 128 together. The terminals can be binded, e.g., by forming one of the terminals 119 and 128 from gold (Au) and the other of the terminals 119 and 128 from tin (Sn) to utilize eutectic.

With the configuration, a relatively simple technique such as printing, etching can be used to form coil 44 on film 126. Furthermore, a relatively simple bonding technique, such as bumping, soldering can be used to connect IC chip 124 terminal 119 and coil 44 terminal 128 together. Thus coil 44 and IC chip 124 can relatively readily be integrated together.

Figure 7:
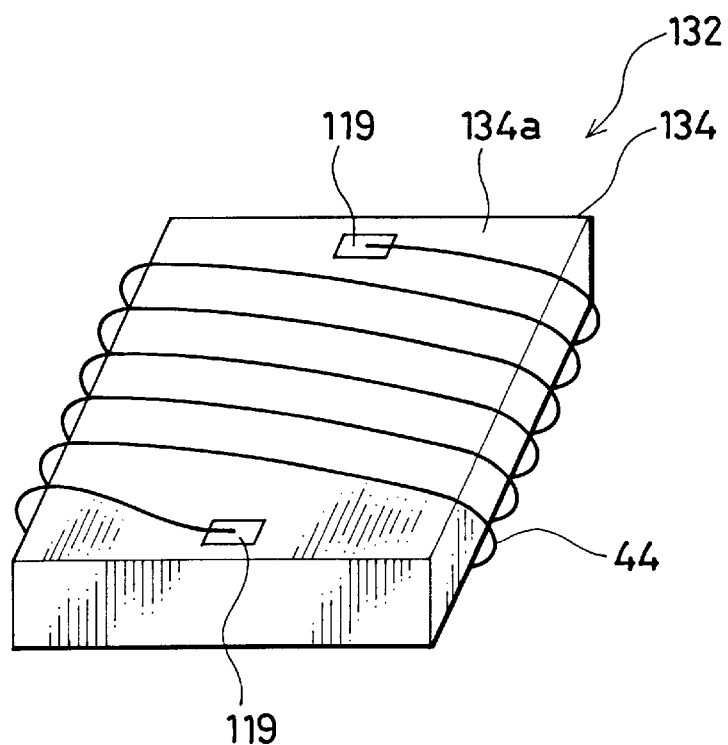
FIG. 7 is a conceptual view of an IC chip module 132 as a circuit chip module of still another embodiment of the present invention.

FIG. 7 is a conceptual view of an IC chip module 132 as a circuit chip module of still another embodiment of the present invention. An IC card with IC chip module 132 is substantially similar in appearance and cross section to IC card 100 (shown in FIGS. 1 and 2). Furthermore the IC card with IC chip module 132 is also similar in operation to IC card 100.

In the present embodiment, IC chip module 132 is comprised of an IC chip 134 serving as a circuit chip, and coil 44 wound around IC chip 134.

IC chip 134 is substantially similar in configuration to the aforementioned IC chip 114 (shown in FIG. 4), with terminal 119 provided at an upper surface 134a covered with a passivation film. Coil 44 wound around IC chip 134 has an end connected to terminal 119.

With the configuration, it is not necessary to previously form a dedicated coil. Simply winding a metal wire around IC chip 134 can readily form coil 44.

Figure 8:
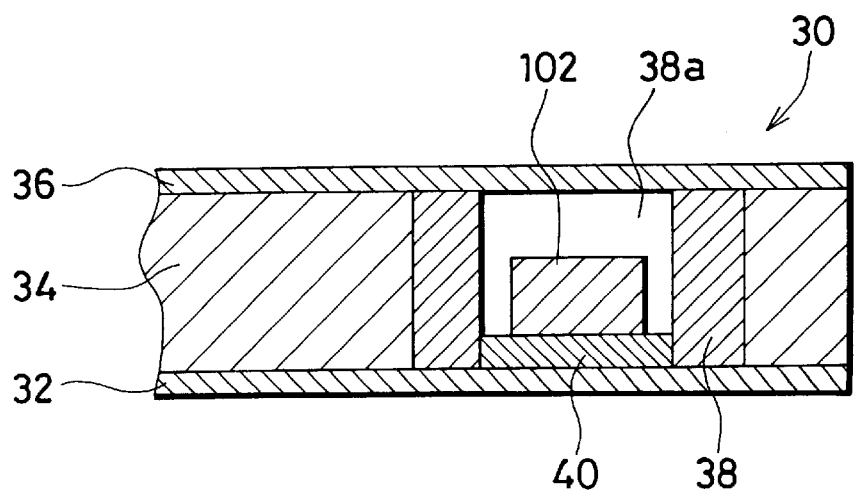
FIG. 8 is a cross section of a non-contact IC card 30 as a circuit chip mounted card of still another embodiment of the present invention.

FIG. 8 is a cross section of a non-contact IC card as a circuit chip mounted card of still another embodiment of the present invention. IC card 30 is substantially similar in appearance to IC card 100 (shown in FIG. 1). Furthermore, IC chip module 102 itself is substantially similarly to that of IC card 100 (shown in FIG. 3). Thus IC card 30 is also similar in operation to IC card 100.

As shown in FIG. 8, IC card 30 is comprised of surface member 32 corresponding to a first base member, core member 34, and surface member 36 corresponding to a second base member that are deposited successively in the order of appearance above. Surface member 32, 36 is formed, e.g., of synthetic resin such as vinyl chloride, polyethylene terephthalate (PET). Core member 34 is formed from synthetic resin.

A ceramic frame 38 is buried in the layer formed of core member 34. Ceramic frame 38 is formed of ceramic and has a cylindrical shape. Ceramic frame 38 corresponds to a frame of a reinforcement body. In other words, in the present embodiment herein the reinforcement body is constructed only of the frame.

Ceramic frame 38 has a hollow internal portion 38a. At a lower end of ceramic frame 38 internal portion 38a, a flexible member 40 serving as a buffering member is provided in contact with surface member 32. Flexible member 40 is formed of adhesive silicon rubber. Flexible member 40 supports thereon IC chip module 102 serving as a circuit chip module.

The reinforcement body formed of ceramic can provide high rigidity. Thus ceramic frame 38 buried in the layer formed of core member 34 can remarkably enhance the rigidity of IC card 30 against bending, twisting and pressing forces in a vicinity of ceramic frame 38.

Thus, if IC card 30 receives a strong bending, twisting or pressing force or the like, IC chip module 102 arranged in internal portion 38a of the ceramic frame will not deform significantly and will thus hardly be damaged, so that the reliability of IC card 30 can be enhanced.

Since IC chip module 102 is fixed via flexible member 40, any impact experienced by IC card 30 is not directly transmitted to IC chip module 102. This can alleviate the damage to IC chip module 102 that would be caused by the impact.

It should be noted that in the present embodiment, surface member 32, 36 is 0.1 mm thick and the entirety of IC card 30 is 0.768 mm thick. Furthermore, IC chip module 102 is a cube having a side of 3 mm and a thickness of 0.25 mm. Flexible member 40 is 0.118 mm thick. Ceramic frame 38 is 0.568 mm high. Ceramic frame 38 has an inner diameter set such that the clearance from the incorporated IC chip module 102 is approximately 0.2 to 0.3 mm. Ceramic frame 38 also has an outer diameter of approximately 23 mm. It should be noted, however, that the present invention is not limited to the above dimensions or materials.

It should be noted that while in the present embodiment IC chip module 102 is fixed to surface member 32 with flexible member 40 interposed therebetween, as shown in FIG. 8, IC chip module 102 may be fixed directly to surface member 32 without flexible member 40 interposed therebetween.

Figure 9:
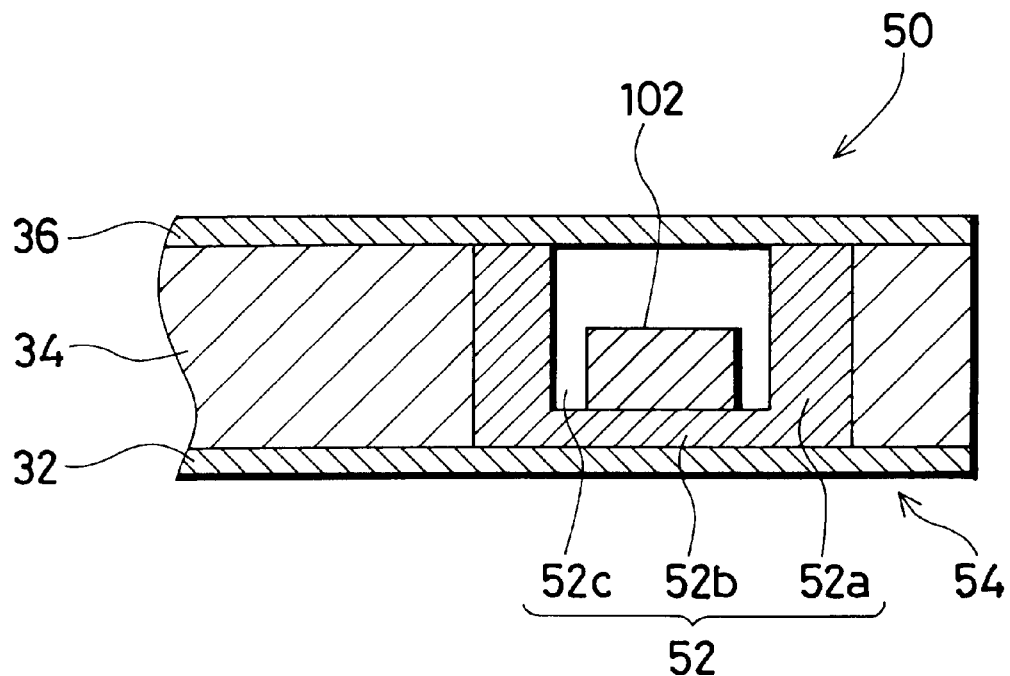
FIG. 9 is a cross section of a non-contact IC card 50 as a circuit chip mounted card of still another embodiment of the present invention.

FIG. 9 is a cross section of a non-contact IC card 50 as a circuit chip mounted card of still another embodiment of the present invention. IC card 50 is similar in appearance to IC card 30 (shown in FIG. 1).

As shown in FIG. 9, however, a ceramic frame 52 of IC card 50 is different in shape from ceramic frame 38 (shown in FIG. 8) of IC card 30. More specifically, ceramic frame 38 is constructed only of a cylindrical frame, whereas ceramic frame 52 is comprised of a cylindrical portion 52a as a frame and a bottom 52b in the form of a plate integrated with a lower end of cylindrical portion 52a.

Furthermore, as shown in FIG. 9, IC chip module 102 is fixed directly to bottom 52b of a U-shaped space 52c provided by the cylindrical portion 52a and bottom 52b of ceramic frame 52.

Bottom 52b integrated with the lower end of cylindrical portion 52a allows the rigidity of ceramic frame 52 to be further enhanced. Thus a desired rigidity can be ensured if a dimension in the direction of a plane of ceramic frame 52 (the X and Y directions of FIG. 1) is increased to some extent. Accordingly IC chip module 102 can be increased in its dimensions and accordingly coil 44 (shown in FIG. 3) incorporated in IC chip module 102 can further be increased in its dimensions.

Furthermore, as shown in FIG. 9, ceramic frame 52 and IC chip module 102 fixed to ceramic frame 52 configure a frame module 54. The moduled frame can enhance operability in manufacturing the card and reduce the cost for manufacturing the same.

It should be noted that while in the present embodiment IC chip module 102 is fixed directly to ceramic frame 52 bottom 52b, flexible member 40 as shown in FIG. 8 can be interposed between IC chip module 102 and ceramic frame 52 bottom 52b. Such configuration can conveniently alleviate an impact experienced by the IC card.

Figure 12:
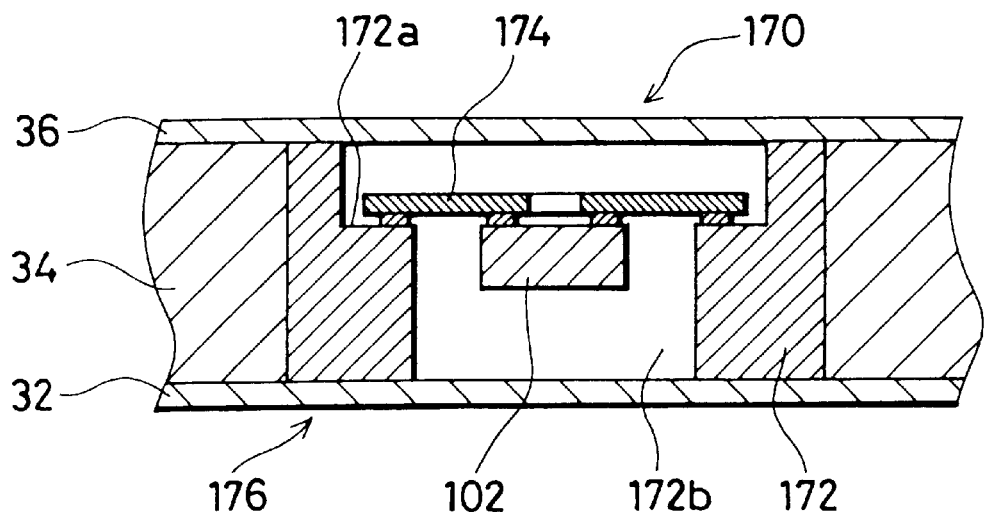
FIG. 12 is a cross section of a non-contact IC card 170 as a circuit chip mounted card of still another embodiment of the present invention.
Figure 13:
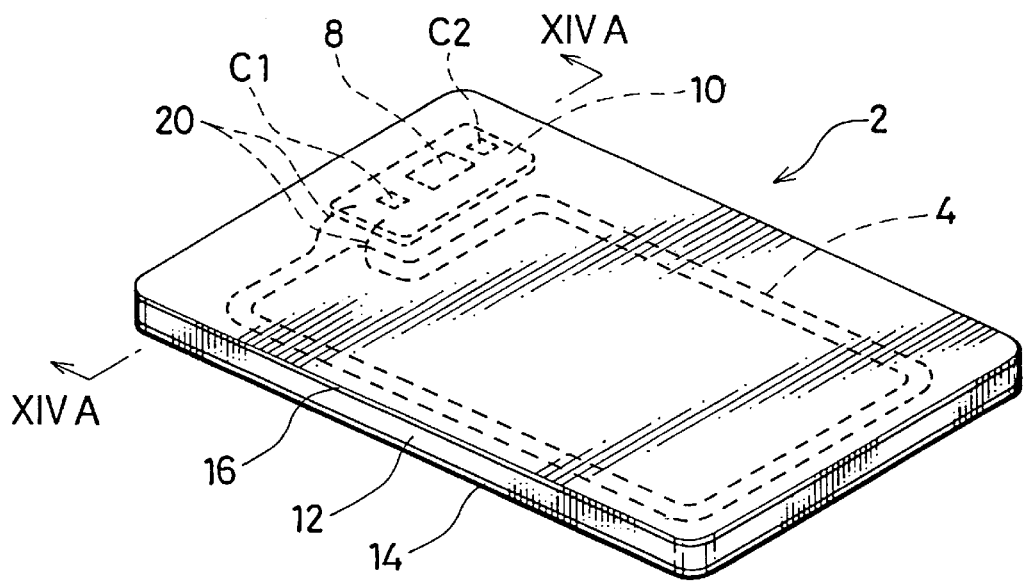
FIG. 13 shows one example of conventional, non-contact IC cards.

FIG. 12 is a cross section of a non-contact IC card 170 as a circuit chip mounted card of still another embodiment of the present invention. IC card 107 is similar in appearance to IC card 30 (shown in FIG. 1).

It should be noted, however, that as shown in FIG. 12, IC card 170 ceramic frame 172 in the form of a frame differs in shape from IC card 30 ceramic frame 38 (shown in FIG. 8). More specifically, ceramic frame 172 is externally similar to ceramic frame 38, in the form of a single cylinder, while it is internally in the form of a stepped cylinder and thus different from ceramic frame 38.

Furthermore, as shown in FIG. 12, a supporting film 174 serving as a buffering member adheres to a step 172a of ceramic frame 172. Supporting film 174 is a synthetic resin film provided in the form of a hollowed disk. Thus, supporting film 174 is suspended in an internal space 172b of ceramic frame 172, supported by step 172a of ceramic frame 172.

IC chip module 102 adheres to substantially the center of supporting film 174. Thus, IC chip module 102 is suspended in internal space 172b of ceramic frame 172, supported by supporting film 174.

The configuration as above conveniently ensures that an impact received by the IC card can further be alleviated. Furthermore, as shown in FIG. 12, ceramic frame 172, supporting film 174 and IC chip module 102 configure frame module 176. Such module can enhance operability in manufacturing the card and thus reduce the cost for manufacturing the same.

It should be noted that the buffering member is not limited in shape or material to the synthetic resin film in the form of a hollowed disk as provided in the present embodiment.

It should also be noted that while in the above embodiments the reinforcement body is a penetrated cylinder or a bottomed cylinder, the internal and external shapes of the cylinder are not limited to the aforementioned forms of cylinder. For example, the reinforcement body may be a quadratic prism or the like. The reinforcement body is also not limited to a cylinder and may, for example, be a flat plate. Furthermore, there may be provided a plurality of reinforcement bodies. For example, reinforcement bodies can be provided over and under a circuit chip module to sandwich the same.

It should also be noted that while the present embodiment uses a reinforcement body of ceramic, the reinforcement body may be formed of any other material than ceramic that has significant rigidity. For example, it may be formed of a metal material such as stainless steel, a hard synthetic resin, and the like.

It should also be noted that the reinforcement body that reinforces an IC card with IC chip module 102 in the above embodiment is also similarly applicable to an IC card with IC chip module 112 (shown in FIG. 4), 122 (shown in FIG. 6) or 132 (shown in FIG. 7).

Description will now be made with respect to an IC chip module as a circuit chip module of still another embodiment of the present invention. The IC chip module is substantially similar in structure to the FIG. 3 IC chip module 102, although they are different in that the resonance circuit of the FIG. 3 IC chip 104 corresponding to IC chip module 102 is similar to resonance circuit 22 shown in FIG. 14B, whereas the resonance circuit of an IC chip corresponding to the IC chip module of the present embodiment is a resonance circuit 150 shown in FIG. 10.

Figure 10:
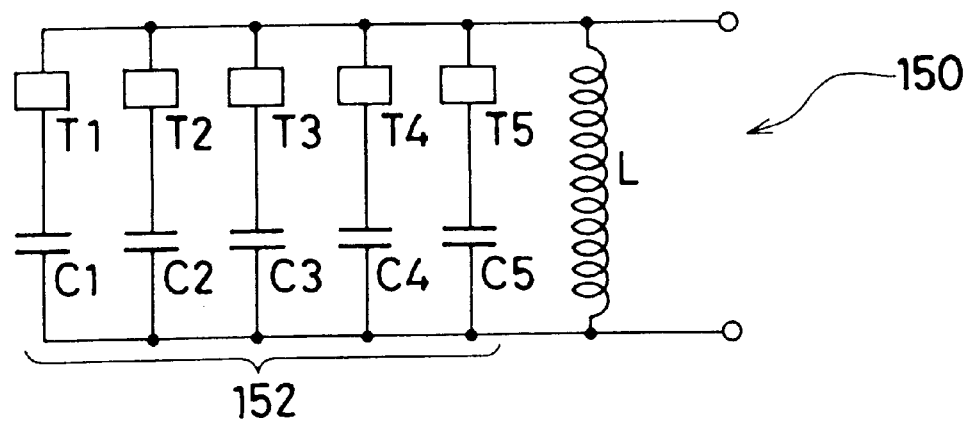
FIG. 10 shows a resonance circuit 150 of an IC chip configuring an IC chip module as a circuit chip module of still another embodiment of the present invention.

Resonance circuit 150 is comprised of a capacitor portion 152 including five capacitors C1 to C5 and five laser taps T1 to T5, and a coil L that are connected as shown in FIG. 10. In capacitor portion 152, capacitors C1 to C5 are connected in parallel via laser taps T1 to T5 which are conductive and can be cut off by laser radiation.

Any appropriate laser tap T1 to T5 can be cut off to adjust the composite capacitance of capacitor portion 152. The adjustment of the composite capacitance of capacitor portion 152 allows a resonance frequency of resonance circuit 150 to be adjusted. It should be noted that laser taps T1 to T5 are cut off in a step subsequent to the contraction of capacitors C1 to C5, coil L and the like in the IC chip.

For example, resonance frequency can be measured while laser taps T1 to T5 are cut off successively, and the cutting-off of laser taps T1 to T5 can be terminated when the resonance frequency attains a predetermined threshold value.

Furthermore, if less variations are found between IC chips manufactured in the same process, an IC chip can be used as a testing sample to find an optimal cutting pattern. Thereafter, for IC chips manufactured in the same process, laser taps T1 to T5 may be cut off in the same pattern.

Furthermore, if there are various types of IC chips, the pattern for cutting off laser taps T1 to T5 can be varied for each type of IC chip to set a different resonance frequency for each type of IC chip.

Capacitors C1 to C5 may have the same capacitance or may each have a different capacitance. For example, capacitors C1 to C5 may be 1 $\mu$F, 2 $\mu$F, 4 $\mu$F, 8 $\mu$F and 16 $\mu$F, respectively, in capacitance. This allows the composite capacitance to be tailored in the range of 1 $\mu$F to 31 $\mu$F by an interval of 1 $\mu$F.

It should be noted that any other number than five of capacitors and laser taps may be used.

Figure 11:
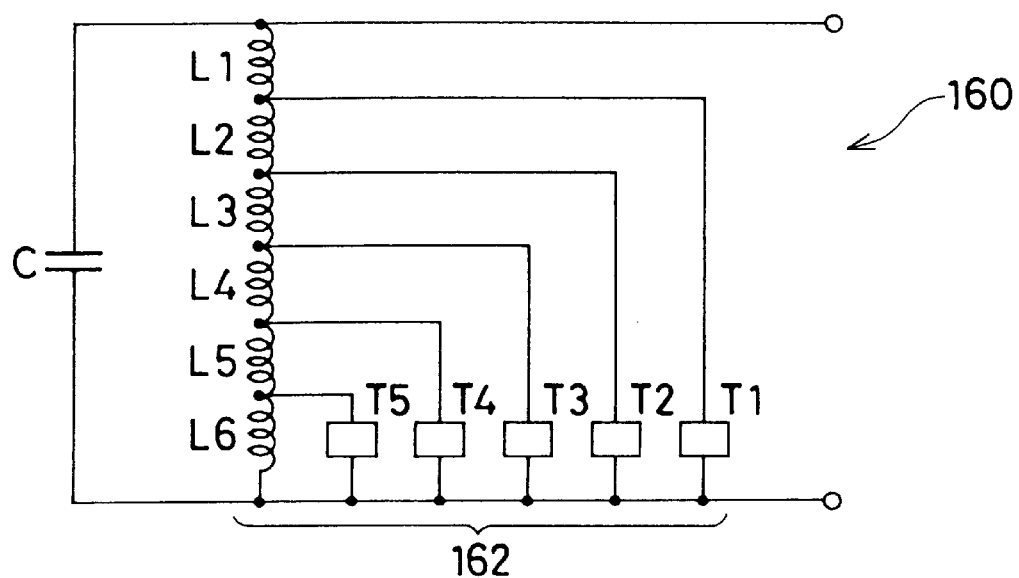
FIG. 11 shows a resonance circuit 160 of an IC chip configuring an IC chip module as a circuit chip module of still another embodiment of the present invention.

The FIG. 10 resonance circuit 150 may be substituted by the FIG. 11 resonance circuit 160. Resonance circuit 160 is comprised of a coil portion 162 including six coils L1 to L6 and five laser taps T1 to T5, and a capacitor C that are connected as shown in FIG. 11. In coil portion 162, coils L1 to L6 are connected in series and each connection point between the coils is short-circuited via laser taps T1 to T5.

Laser taps T1 to T5 can be cut off in ascending order of their numeral references to adjust the composite inductance of coil portion 162. The adjustment of the composite inductance of coil portion 162 allows a resonance frequency of resonance circuit 160 to be adjusted. It should be noted that any other number than five of coils and laser taps may be used.

Furthermore, the resonance circuit with adjustable resonance frequency is not limited to those described above. For example, the FIG. 10 resonance circuit 150 and the FIG. 11 resonance circuit 160 can be combined together to construct a resonance circuit.

The resonance circuit having an adjustable resonance frequency allows the resonance circuit to have capacitance or inductance adjustable after the construction of capacitors and coils in an IC chip. Thus, the resonance frequency can be adjusted after the circuit elements configuring the resonance circuit are all constructed in the IC chip.

That is, if the conditions for manufacturing the same vary, the resonance frequency can be constant to some extent and an IC card with such an IC chip mounted thereto can be enhanced in reliability. Furthermore an IC chip accommodating a wide range of resonance frequencies can be obtained without changing a masking pattern for forming a circuit element thereof in the process for manufacturing the same, so that the cost for manufacturing the same can be reduced.

It should also be noted that the antenna is not limited to a coil looped as an antenna in each of the above embodiments. The antenna may be, e.g., a metal wire in a straight line, a metal wire in the form of a proceeding snake or the like.

It should also be noted that while in each of the above embodiments the present invention has been applied to a single-coil, non-contact IC card, the present invention is also applicable to a multiple-coil, non-contact IC card. The present invention is also applicable to contact IC cards. The present invention is also applicable not only to IC cards but generally to modules and cards with a circuit chip mounted thereto. It should be noted that the card referred to herein means generally plate-like members, including credit cards, monthly train tickets, train tickets and the like.

What is claimed is:

1. A circuit chip mounted card mounting thereto an antenna using an electromagnetic wave to provide communication and a processing unit providing a process associated with the communication, characterized in that:

inside or outside said circuit chip including said processing unit, a terminal of said antenna is connected directly to a terminal of said circuit chip;

said circuit chip has a surface provided with a terminal electrically connected to said processing unit incorporated in said circuit chip;

said antenna is a metal wire fixed on a film; and said antenna is arranged in contact with a surface of said circuit chip and is also electrically connected to said terminal at said surface of said circuit chip.

2. A circuit chip mounted card mounting thereto an antenna using an electromagnetic wave to provide communication and a processing unit providing a process associated with the communication, characterized in that:

inside or outside said circuit chip including said processing unit, a terminal of said antenna is connected directly to a terminal of said circuit chip;

said circuit chip has a surface provided with a terminal electrically connected to said processing unit incorporated in said circuit chip; and said antenna is a metal wire wounded around said circuit chip and electrically connected to said terminal at said surface of said circuit chip.

3. A circuit chip mounted card mounting thereto an antenna using an electromagnetic wave to provide communication and a processing unit providing a process associated with the communication, characterized in that:

Inside or outside said circuit chip including said processing unit, a terminal of said antenna is connected directly to a terminal of said circuit chip;

said circuit chip has a surface provided with a terminal electrically connected to said processing unit incorporated in said circuit chip; and said antenna is a metal wire fixed on a surface of said circuit chip and electrically connected to said terminal at said surface of said circuit chip.

4. A circuit chip mounted card mounting thereto an antenna using an electromagnetic wave to provide communication and a processing unit providing a process associated with communication, characterized in that:

inside or outside such circuit chip including said processing unit, a terminal of said antenna is connected directly to a terminal of said circuit chip; and said antenna is constructed of a wiring layer provided in said circuit chip and is also electrically connected to said processing unit within said circuit chip.

5. The circuit chip mounted card of claim 4, characterized in that a resonance circuit comprised of a capacitor provided internal to said circuit chip and a coil serving as said antenna has an adjustable resonance frequency.

6. The circuit chip mounted card of claim 5, characterized in that said circuit chip has a plurality of capacitors previously constructed therein and having an interconnect selectively cut off to obtain a desired resonance frequency.

7. The circuit chip mounted card of claim 5, characterized in that said circuit chip has a plurality of coils previously constructed therein and having an interconnect selectively cut off to obtain a desired resonance frequency.

8. A circuit chip mounted card mounting thereto an antenna using an electromagnetic wave to provide communication and a processing unit providing a process associated with the communication, comprising a first base member;

a second base member spaced apart from said first base member by a predetermined distance in a direction of a thickness of said card, a core member layer arranged between said first base member and said second base member;

a circuit chip internally provided with said processing unit and also provided at a surface thereof with a terminal electrically connected to said processing unit, and an antenna formed by fixing a metal wire on a film, said antenna being arranged on a surface of said circuit chip and electrically connected to said terminal at said surface of said circuit chip, said circuit chip mounted card characterized in that said circuit chip and said antenna are arranged at said core member layer.

9. A circuit chip module used for a card with a circuit chip mounted, comprising a circuit chip including a processing unit for providing a process associated with communication, and an antenna electrically connected to said processing unit and having a terminal directly connected to a terminal of said circuit chip inside or outside said circuit chip, using an electromagnetic wave to provide the communication, said circuit chip module characterized in that said antenna is a metal wire fixed on a film arranged in contact with a surface of said circuit chip.

10. A circuit chip module used for a card with a circuit chip mounted thereto, comprising a circuit chip including a processing unit for providing a process associated with communication, and an antenna electrically connected to said processing unit and having a terminal directly connected to a terminal of said circuit chip inside or outside said circuit chip, using an electromagnetic wave to provide the communication, the module characterized in that said circuit chip includes a capacitor and said antenna is constructed of a coil, said capacitor and said coil being used to construct a resonance circuit, said resonance circuit having an adjustable resonance frequency.

11. The circuit chip mounted card of claim 1, wherein a reinforced body including a frame is arranged to surround said circuit chip.

12. The circuit chip mounted card of claim 2, wherein a reinforced body including a frame is arranged to surround said circuit chip.

13. The circuit chip mounted card of claim 3, wherein a reinforced body including a frame is arranged to surround said circuit chip.

14. The circuit chip mounted card of claim 4, wherein a reinforced body including a frame is arranged to surround said circuit chip.

15. The circuit chip mounted card of claim 8, wherein a reinforced body including a frame is arranged to surround said circuit chip.

16. The circuit chip mounted card of claim 1, characterized in that at least one capacitor of circuit elements configuring said circuit chip is constructed of ferroelectronics.

17. The circuit chip mounted card of claim 2, characterized in that at least one capacitor of circuit elements configuring said circuit chip is constructed of ferroelectronics.

18. The circuit chip mounted card of claim 3, characterized in that at least one capacitor of circuit elements configuring said circuit chip is constructed of ferroelectronics.

19. The circuit chip mounted card of claim 4, characterized in that at least one capacitor of circuit elements configuring said circuit chip is constructed of ferroelectronics.

20. The circuit chip mounted card of claim 8, characterized in that at least one capacitor of circuit elements configuring said circuit chip is constructed of ferroelectronics.

21. The circuit chip mounted card of claim 1, characterized in that said processing unit of said circuit chip includes a non-volatile memory and a modulation/demodulation circuit.

22. The circuit chip mounted card of claim 2, characterized in that said processing unit of said circuit chip includes a non-volatile memory and a modulation/demodulation circuit.

23. The circuit chip mounted card of claim 3, characterized in that said processing unit of said circuit chip includes a non-volatile memory and a modulation/demodulation circuit.

24. The circuit chip mounted card of claim 4, characterized in that said processing unit of said circuit chip includes a non-volatile memory and a modulation/demodulation circuit.

* * * * *

UNITED STATES PATENT AND TRADEMARK OFFICE
CERTIFICATE OF CORRECTION

PATENT NO. : 6,181,001 B1  
DATED : January 30, 2001  
INVENTOR(S) : Yoshihiro Ikefuji et al.

Page 1 of 1

It is certified that error appears in the above-identified patent and that said Letters Patent is hereby corrected as shown below:

<u>Claim 25,</u>
Please add as follows:

-- 25. The circuit chip mounted card of claim 8, characterized in that said processing unit of said circuit chip includes a non-volatile memory and a modulation/demodulation circuit --

Signed and Sealed this

Fifth Day of February, 2002

*Attest:*

JAMES E. ROGAN  
*Director of the United States Patent and Trademark Office*

*Attesting Officer*